(12) United States Patent
Tan

(10) Patent No.: US 8,836,093 B2
(45) Date of Patent: Sep. 16, 2014

(54) LEAD FRAME AND FLIP CHIP PACKAGE DEVICE THEREOF

(71) Applicant: Silergy Semiconductor Technology (Hangzhou) Ltd, Hangzhou (CN)

(72) Inventor: Xiaochun Tan, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 81 days.

(21) Appl. No.: 13/672,957

(22) Filed: Nov. 9, 2012

(65) Prior Publication Data
US 2013/0134568 A1    May 30, 2013

(30) Foreign Application Priority Data
Nov. 29, 2011  (CN) .......................... 2011 1 0385941

(51) Int. Cl.
| | |
|---|---|
| H01L 23/495 | (2006.01) |
| H05K 7/10 | (2006.01) |
| H05K 7/02 | (2006.01) |
| H01L 23/31 | (2006.01) |

(52) U.S. Cl.
CPC .......... *H01L 23/495* (2013.01); *H01L 23/4951* (2013.01); *H05K 7/1061* (2013.01); *H01L 23/3107* (2013.01); *H01L 2224/16245* (2013.01); *H01L 23/49541* (2013.01); *H01L 23/49548* (2013.01); *H01L 2224/16145* (2013.01); *H05K 7/02* (2013.01)
USPC ............ 257/676; 257/E23.039; 257/E23.033; 257/E23.046; 257/673

(58) Field of Classification Search
USPC .................. 257/673, 676, E23.033, E23.039, 257/E23.046
See application file for complete search history.

(56) References Cited

U.S. PATENT DOCUMENTS

| | | | | |
|---|---|---|---|---|
| 5,648,682 | A  * | 7/1997 | Nakazawa et al. | 257/673 |
| 2005/0029636 | A1* | 2/2005 | Paek | 257/666 |
| 2005/0139980 | A1* | 6/2005 | Burns | 257/686 |
| 2006/0138620 | A1* | 6/2006 | Yagi | 257/676 |
| 2010/0006993 | A1* | 1/2010 | Trasporto et al. | 257/676 |
| 2010/0084749 | A1* | 4/2010 | Hong et al. | 257/673 |
| 2011/0175217 | A1* | 7/2011 | Jaunay et al. | 257/692 |
| 2012/0068320 | A1* | 3/2012 | Yang et al. | 257/676 |
| 2012/0153447 | A1* | 6/2012 | Jiang | 257/673 |
| 2013/0043573 | A1* | 2/2013 | Williams et al. | 257/676 |

\* cited by examiner

*Primary Examiner* — Victor A Mandala
(74) *Attorney, Agent, or Firm* — Michael C. Stephens, Jr.

(57) ABSTRACT

The present invention relates to the field of semiconductor chip packages, and more specifically to a lead frame and flip chip package device thereof. In one embodiment, a lead frame for electrically connecting a chip to outside leads, can include a plurality of lead fingers, where each of the plurality of lead fingers comprises a plurality of outburst regions extending from an edge thereof. In one embodiment, a flip chip package device can include: a chip and a plurality of solder bumps, where one surface of the chip is connected to a first surface of each of the plurality of solder bumps; and the lead frame, where second surfaces of each of the plurality solder bumps are connected with corresponding outburst regions of the lead frame to connect the chip to the lead frame through the solder bumps.

11 Claims, 7 Drawing Sheets

LEAD FRAME AND FLIP CHIP PACKAGE DEVICE THEREOF

RELATED APPLICATIONS

This application claims the benefit of Chinese Patent Application No. 201110385941.8, filed on Nov. 29, 2011, which is incorporated herein by reference in its entirety.

FIELD OF THE INVENTION

The present invention relates to the field of semiconductor chip packages, and more specifically to a lead frame and flip chip package device thereof.

BACKGROUND

Along with increasing market demands for reduced production costs and sizes of electronic terminal devices, chip package technology is facing many challenges. Currently, standard flip chip package technology is widely used because of its relatively short connecting wires, good electrical performance, and small volume.

SUMMARY

In one embodiment, a lead frame for electrically connecting a chip to outside leads, can include a plurality of lead fingers, where each of the plurality of lead fingers comprises a plurality of outburst regions extending from an edge thereof.

In one embodiment, a flip chip package device can include: a chip and a plurality of solder bumps, where one surface of the chip is connected to a first surface of each of the plurality of solder bumps; and the lead frame, where second surfaces of each of the plurality solder bumps are connected with corresponding outburst regions of the lead frame to connect the chip to the lead frame through the solder bumps.

Embodiments of the present invention can advantageously provide several advantages over conventional approaches. For example, during the flip chip packaging process, the lead frame can be connected to the chip precisely by setting outburst regions on the lead frame, where the outburst regions can be connected to the solder bumps of the chip one by one. In addition, the size and shape of solder bumps may not substantially change during the melting and connecting process. Other advantages of the present invention may become readily apparent from the detailed description of preferred embodiments below.

DETAILED DESCRIPTION

Figure 1:
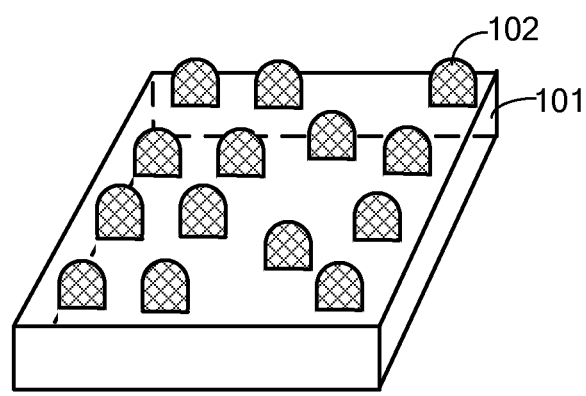
FIG. 1 is a diagram of an example semiconductor chip with solder bumps.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed description which followed are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to actively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Embodiments of the present invention can advantageously provide several advantages over conventional approaches. For example, during the flip chip packaging process, the lead frame can be connected to the chip precisely by setting outburst regions on the lead frame, where the outburst regions can be connected to the solder bumps of the chip one by one. In addition, the size and shape of solder bumps may not substantially change during the melting and connecting process. The invention, in its various aspects, may be explained in greater detail below with regard to exemplary embodiments.

With reference to FIG. 1, shown is a diagram of an example semiconductor chip with solder bumps. In this example, solder bumps 102 can be used to establish a mechanical connection, an electrical connection, and a thermal connection between chip 101 and a lead frame. Normally, symmetrically arrayed tin solder balls can be applied to form solder bumps.

Figure 2:
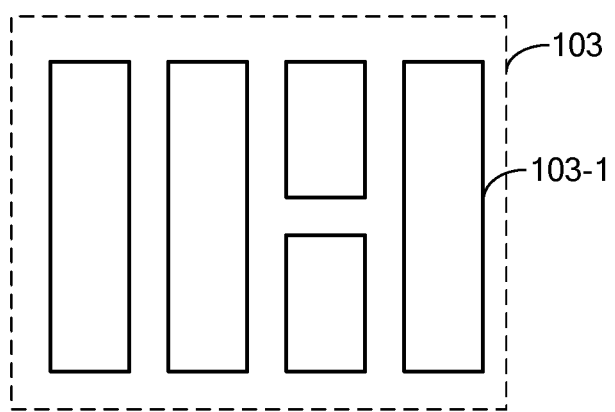
FIG. 2 is a structural diagram of an example lead frame.

With reference to FIG. 2, shown is a diagram of an example lead frame. In this example, lead frame 103 can include a group of lead fingers 103-1 that can be used as a chip carrier. Also, the arrangement of lead fingers 103-1 can be consistent with the arrangement of solder bumps 102 shown in FIG. 1. Further, lead fingers 103-1 can be used to establish an electrical connection between the lead terminals of circuitry inside the chip and outside leads. Bond pads corresponding to the solder bumps 102 can be set on lead fingers 103-1, and the diameter of bond pads may be larger than lead fingers 103-1. During the flip chip packaging process, chip 101 may be flipped and heated, and then can be connected to lead frame 103 through the conjunction of melted solder bumps 102 and bond pads to form a complete semiconductor device.

Figure 3:
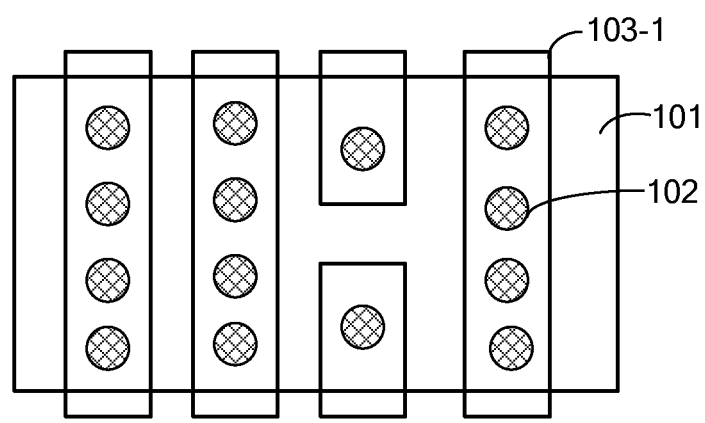
FIG. 3 is a top view of an example semiconductor chip package device.

With reference to FIG. 3, shown is a top view of an example semiconductor chip package device composed by a semiconductor chip and a lead frame. In this example, solder bumps 102 can be mounted directly on the connecting surfaces of lead frame 103 according to conventional flip chip package approaches.

Figure 4A:
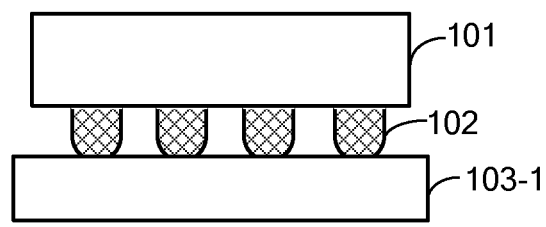
FIG. 4A is a first cross sectional view of the semiconductor chip package shown in FIG. 3.
Figure 4B:
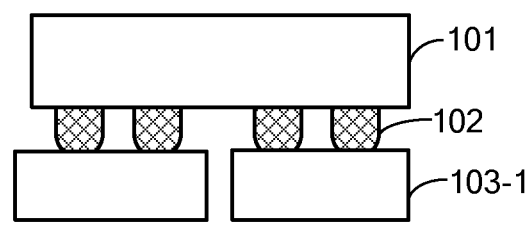
FIG. 4B is a second cross sectional view of the semiconductor chip package shown in FIG. 3.

FIG. 4A and FIG. 4B show respective first and second cross sectional views of the example semiconductor chip package device shown in FIG. 3. The main difference between the two diagrams is that the size of lead fingers 103-1 can be changed in accordance with the arrangement of solder bumps 102. During a flip chip packaging process, connecting melted solder bumps 102 to the bond pads precisely is a key step that may affect the semiconductor chip performance. However, in practice, solder bumps 102 cannot always connect to the bond pads precisely. Thus, there can be some deviations on the left-right position or front-back position that cannot connect all solder bumps 102 to the bond pads.

As a result, connections between chip 101 and lead frame 103 may further decrease the stability of chip 101. Further, the package of the semiconductor chip may be affected to possibly cause failure of chip package. In addition, during the melting process of solder bumps 102, the magnetic connection and the electrical connection between solder bumps 102 and the bond pads may be affected because the size and shape of melted solder bumps 102 may substantially change. While lead frame 103 can always be designed larger and broader to meet requirements of connecting all solder bumps 102 to lead frame 103, such an approach may increase production costs.

In one embodiment, a lead frame for electrically connecting a chip to outside leads, can include a plurality of lead fingers, where each of the plurality of lead fingers comprises a plurality of "outburst regions" extending from an edge thereof. For example, such outburst regions can include extensions or protrusions from a substantially straight or gradually curved line or edge of the lead finger. For example, one side of a lead finger may have a plurality of round shaped or square shaped outburst regions from an otherwise substantially straight lead finger side.

Figure 5:
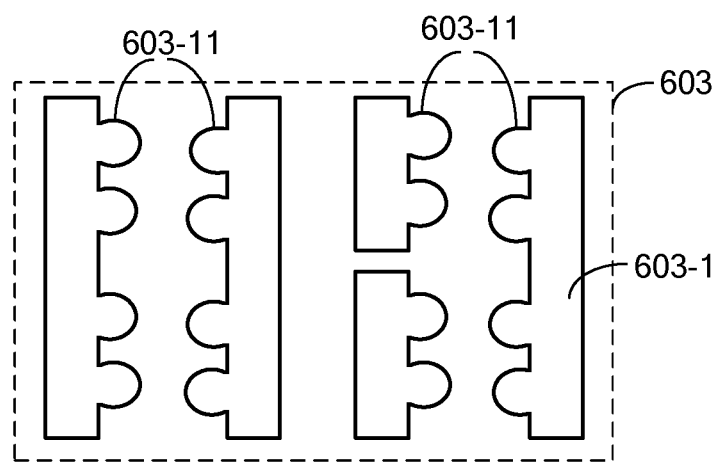
FIG. 5 is a structural diagram of an example lead frame in accordance with embodiments of the present invention.

With reference to FIG. 5, shown is a structural diagram of an example lead frame in accordance with embodiments of the present invention. For example, the lead frame can be used in a flip chip packaging process for electrically connecting the chip to outside leads. A group of lead fingers 603-1 with a host of outburst regions 603-11 extending from an edge or side of a lead finger can be mounted on lead frame 603. For example, outburst regions 603-11 can be arrayed at the left side or right side along a length direction of lead fingers 603-1 to facilitate the packaging process.

The upper surfaces of outburst regions 603-11 can be at a same level as upper surfaces of remaining parts of lead fingers 603-1, or the upper surfaces of outburst regions 603-11 can be lower than upper surfaces of remaining parts of lead fingers 603-1. In one example of the latter, the upper surfaces of the outburst region can be in an indentation structure, and the chip can be attached on the lead frame steadily by this indentation structure.

In this example, outburst regions 603-11 may be arrayed along a length direction of lead fingers, and the shape of outburst regions 603-11 may be in round shape. However, a wide variety of arrangements and/or shapes (e.g., square, diagonal, etc.) of outburst regions can also be supported in particular embodiments. Also, people skilled in the art will recognize that the lead frame can be formed by metal (e.g., copper), or a metal alloy, and by utilizing cutting, stamping or etching technology.

In one embodiment, a flip chip package device can include: a chip and a plurality of solder bumps, where one surface of the chip is connected to a first surface of each of the plurality of solder bumps; and the lead frame, where second surfaces of each of the plurality solder bumps are connected with corresponding outburst regions of the lead frame to connect the chip to the lead frame through the solder bumps.

Figure 6:
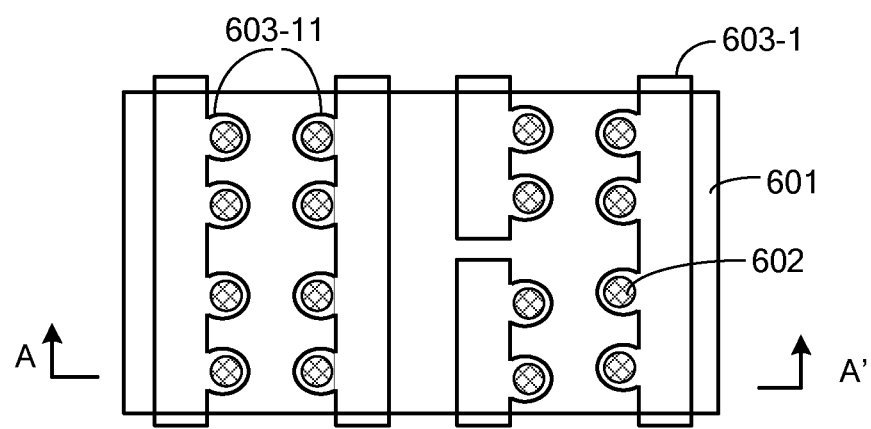
FIG. 6 is a top view of an example flip chip package in accordance with embodiments of the present invention.

With reference to FIG. 6, shown is a top view of an example flip chip package device in accordance with embodiments of the present invention. The flip chip package device can include semiconductor chip 601, solder bumps 602, and lead frame 603. Chip 601 can be an integrated circuit, and can be connected to other outside circuits or devices (e.g., printed circuit board, etc.) through lead frame 603. Solder bumps 602 can be formed by conductive metal or a metal alloy. Lead frame 603 can be formed by a group of lead fingers 603-1 with outburst regions 603-11.

One surface of chip 601 can be connected to first surfaces of solder bumps 602, where solder bumps 602 can be tin solder balls that are symmetrically arrayed on chip 601. Also, the size, shape, and quantity of tin solder balls can be identical to outburst regions 603-11 of lead frame 603. In this example, tin solder balls can be in a round shape since outburst regions 603-11 of lead frame 603 may be round. Also, the diameter of tin solder balls can be substantially equal to or slightly smaller than the diameter of outburst regions 603-11. In this way, second surfaces of tin solder balls can be connected to corresponding outburst regions 603-11. Thus, the tin solder balls can be mounted on outburst region 603-11 precisely in a one to one correspondence. People skilled in the art will recognize that a first surface of the tin solder balls can be attached to one surface of chip 601 through evaporation, electroplating, and/or screen printing technology.

By applying the above described method, chip 601 can be connected to lead frame 603. In conventional flip chip packaging technology, deviations may be caused by directly connecting the solder bumps of a chip to the pads of lead fingers. However, in particular embodiments, chip 601 can be mounted on lead frame 603 precisely by connecting outburst regions 603-11 of lead fingers 603-1 with solder bumps 602 of chip 601 in a one-to-one correspondence to better affix chip 601.

In this example, upper surfaces of outburst regions 603-11 may be lower than upper surfaces of remaining parts of lead fingers 603-1, so outburst regions 603-11 can involve the above described indentation structure. The surfaces of the indentation structure can be coupled to the surfaces of tin solder balls so as to exactly embed the tin solder balls in a concave part of outburst regions 603-11. In this way, the solder balls can be connected to the outburst regions more precisely. Chip 601 can be steadily connected to lead frame 603 with outburst regions 603-11 with an indentation structure. In addition, during the melting process of tin solder balls, the indentation structure can avoid large deviations of size and position of tin solder balls, thus chip 601 and lead frame 603 can be in better mechanical and electrical connection.

Also, plastic package material can be injected onto a junction of tin solder balls and outburst regions 603-11 to coat the tin solder balls in order to prevent the tin solder balls from being moistened. In addition to the above examples, the flip chip package device of particular embodiments can be implemented by other similar package methods. For example, the upper surfaces of outburst regions 603-11 can be in a same level with the upper surfaces of remaining parts of lead fingers 603-1 and can be directly connected to the tin solder balls to steadily affix the chip. The shape of outburst regions may also be in square shape rather than in a round shape, and the corresponding solder bumps can also be in a square shape in this case.

Figure 7A:
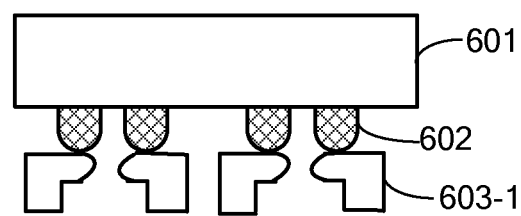
FIG. 7A is a first cross sectional view of the flip chip package shown in FIG. 6.
Figure 7B:
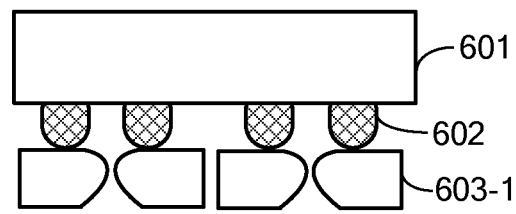
FIG. 7B is a second cross sectional view of the flip chip package shown in FIG. 6.

FIG. 7A and FIG. 7B show respective first and second cross sectional view of the flip chip package device shown in FIG. 6. Both of the cross sectional views are cut along the direction of A-A'. The main difference between the two diagrams is that the thickness of an outburst region can be different than the thickness of the remaining parts of lead fingers in FIG. 7A. In contrast, the thickness of an outburst region can be the same as the thickness of the remaining parts of lead fingers in FIG. 7B. In practical applications, the thickness can be adjusted to achieve the best technical results.

People skilled in the art will recognize that the design method of the lead frame in the above examples can also be applied to other chip carriers of flip chip package devices, such as substrates, circuit boards, or other chip carriers to achieve the same or similar technical results.

As described herein, the lead frame in accordance with embodiments of the present invention may have special designed outburst regions that can correspond to the solder bumps. During the flip chip packaging process, the solder bumps of the chip can be attached to the outburst regions of the lead frame to avoid position deviation problems when solder bumps are directly connected to the lead frame. Thus, the chip can be precisely and better fixed on the lead frame. Also, the solder bumps may not be substantially deformed to achieve better electrical connection between the chip and the lead frame.

The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A lead frame for electrically connecting a chip to outside leads, the lead frame comprising:
    a) a plurality of lead fingers; and
    b) wherein each of said plurality of lead fingers comprises a plurality of outburst regions extending from an edge thereof, and a remaining part; and
    c) wherein upper surfaces of each of said plurality of outburst regions connected to said chip are in a level lower than upper surfaces of each said remaining part of said lead fingers.

2. The lead frame of claim 1, wherein said plurality of outburst regions is arrayed along a length of said lead finger.

3. The lead frame of claim 1, wherein said upper surfaces of each of said plurality of outburst regions are in an indentation structure connected to said chip.

4. The lead frame of claim 1, wherein each of said plurality of outburst regions comprises a diagonal shape.

5. The lead frame of claim 1, wherein each of said plurality of outburst regions comprises a round shape.

6. The lead frame of claim 1, wherein each of said plurality of outburst regions comprises a square shape.

7. A flip chip package device, comprising:
    a) said chip and a plurality of solder bumps, wherein one surface of said chip is connected to a first surface of each of said plurality of solder bumps; and
    b) said lead frame of claim 1, wherein second surfaces of each of said plurality solder bumps are connected with corresponding outburst regions of said lead frame to connect said chip to said lead frame through said solder bumps.

8. The flip chip package device of claim 7, wherein a size, a shape, and a quantity of said second surfaces of said solder bumps match said outburst regions.

9. The flip chip package device of claim 7, wherein a plastic package material is injected into joints of said solder bumps and said outburst regions to coat said solder bumps.

10. The lead frame of claim 1, wherein each of said plurality of plurality of lead fingers comprises copper.

11. The lead frame of claim 1, wherein a thickness of each of said plurality of outburst regions is different than a thickness of each said remaining part.

* * * * *